United States Patent
Liang et al.

(10) Patent No.: US 10,190,207 B2
(45) Date of Patent: Jan. 29, 2019

(54) EVAPORATION METHOD

(71) Applicant: BOE Technology Group Co., Ltd., Beijing (CN)

(72) Inventors: Yinan Liang, Beijing (CN); Lujiang Huangfu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/322,790

(22) PCT Filed: Mar. 28, 2016

(86) PCT No.: PCT/CN2016/077508
§ 371 (c)(1),
(2) Date: Dec. 29, 2016

(87) PCT Pub. No.: WO2016/165553
PCT Pub. Date: Oct. 20, 2016

(65) Prior Publication Data
US 2018/0066351 A1 Mar. 8, 2018

(30) Foreign Application Priority Data

Apr. 15, 2015 (CN) .......................... 2015 1 0178158

(51) Int. Cl.
*C23C 14/24* (2006.01)
*C23C 14/04* (2006.01)
(Continued)

(52) U.S. Cl.
CPC ............ *C23C 14/042* (2013.01); *C23C 14/24* (2013.01); *C23C 14/54* (2013.01); *C23C 14/545* (2013.01); *H01L 51/00* (2013.01)

(58) Field of Classification Search
CPC ....... C23C 14/04; C23C 14/042; C23C 14/24; C23C 14/54
See application file for complete search history.

(56) References Cited

U.S. PATENT DOCUMENTS 6,140,009 A    10/2000  Wolk et al.
7,553,602 B2 *  6/2009  Matsuda ............ B41M 5/38214
                                                    430/200
(Continued)

FOREIGN PATENT DOCUMENTS

CN    102051580 A    5/2011
CN    102477538 A    5/2012
(Continued)

OTHER PUBLICATIONS

Li, Luozhou, et al., "Nanofabrication on unconventional substrates using transferred hard masks". Scientific Reports, 5: 7802, pp. 1-6.*
(Continued)

*Primary Examiner* — Bret P Chen
(74) *Attorney, Agent, or Firm* — Westman, Champlin & Koehler, P.A.

(57) ABSTRACT

An evaporation method includes: evaporating evaporation material and forming evaporation material particles towards one or more transfer substrates by means of an evaporation source, so as to form an intermediate material layer on a surface of the transfer substrate; heating the one or more transfer substrates to evaporate the intermediate material layer located on the transfer substrate towards a target substrate, a temperature of the heated transfer substrate being less than a temperature of the evaporation source. There is further disclosed an evaporation device.

11 Claims, 2 Drawing Sheets

(51) Int. Cl.
*C23C 14/54* (2006.01)
*H01L 51/00* (2006.01)

(56) References Cited

U.S. PATENT DOCUMENTS

| | | | |
|---|---|---|---|
| 7,951,521 B2* | 5/2011 | Matsuo | H01L 51/0013 |
| | | | 428/32.63 |
| 9,444,051 B2* | 9/2016 | Aoyama | H01L 51/0013 |
| 2006/0233965 A1* | 10/2006 | Boulos | C23C 4/12 |
| | | | 427/446 |
| 2007/0072337 A1* | 3/2007 | Matsuzaki | C23C 14/042 |
| | | | 438/99 |
| 2008/0268561 A1* | 10/2008 | Ikeda | C23C 14/12 |
| | | | 438/46 |
| 2010/0159165 A1 | 6/2010 | Ueda et al. | |
| 2011/0293818 A1 | 12/2011 | Madigan et al. | |
| 2013/0084406 A1* | 4/2013 | Yada | H01B 1/08 |
| | | | 427/561 |

FOREIGN PATENT DOCUMENTS

| | | |
|---|---|---|
| CN | 104762599 A | 7/2015 |
| JP | 2007-154253 A | 6/2007 |
| JP | 2007-154283 A | 6/2007 |
| TW | 200628618 A * | 8/2006 |
| TW | 200628618 A | 8/2006 |

OTHER PUBLICATIONS

Lee, Q., et al., "Submicron Transferred-Substrate Heterojunction Bipolar Transistors". IEEE Electron Device Letters, vol. 20, No. 8, Aug. 1999, pp. 396-398.*
International Search Report and Written Opinion of International Application No. PCT/CN2016/077508, dated Jun. 30, 2016, 8 pages.
English translation of Box No. V of the Written Opinion for the International Searching Authority for International Application No. PCT/CN2016/077508, 2 pages.
First Office Action, including Search Report, for Chinese Patent Application No. 201510178158.2, dated Dec. 3, 2015, 15 pages.
Second Office Action for Chinese Patent Application No. 201510178158.2, dated Feb. 22, 2016, 16 pages.
Rejection Decision for Chinese Patent Application No. 201510178158.2, dated Jul. 7, 2016, 18 pages.
Chinese Search Report for Chinese Patent Application No. 201510178158.2, dated Aug. 25, 2015, 12 pages.

* cited by examiner

EVAPORATION METHOD

CROSS-REFERENCE TO RELATED APPLICATION

This application is a Section 371 National Stage Application of International Application No. PCT/CN2016/077508, filed on Mar. 28, 2016, entitled "EVAPORATION METHOD AND EVAPORATION DEVICE", which claims priority to Chinese Application No. 201510178158.2, filed on Apr. 15, 2015, incorporated herein by reference in their entirety.

BACKGROUND

Technical Field

Embodiments of the present disclosure relate to a field of manufacturing display devices, and more particularly, to an evaporation method and an evaporation device.

Description of the Related Art

Organic light emitting diode (OLED) has advantages such as fast response, gorgeous color, good temperature characteristic, wide viewing angle, low power consumption, etc. Therefore, the organic light emitting diode is more and more increasingly used.

OLED display device includes an organic material layer. At present, as a mainstream technology, a linear source evaporation scanning method is used for manufacturing the organic material layer.

SUMMARY

The objective of the embodiments of the present disclosure is to provide an evaporation method and an evaporation device, so as to improve the evaporation accuracy.

In order to achieve the above objective, the embodiments of the present disclosure provide an evaporation method, comprising:

evaporating evaporation material and forming evaporation material particles towards one or more transfer substrates by means of an evaporation source, so as to form an intermediate material layer on a surface of the transfer substrate;

heating the one or more transfer substrates to evaporate the intermediate material layer located on the transfer substrate towards a target substrate, a temperature of the heated transfer substrate being less than a temperature of the evaporation source.

Optionally, a distance between the evaporation source and the transfer substrate and a distance between the transfer substrate and the target substrate are both less than a preset distance.

Optionally, the preset distance is in a range of 200 mm to 600 mm.

Optionally, a ratio of the distance between the transfer substrate and the target substrate to the distance between the evaporation source and the transfer substrate is in a range of $1/3$ to $1/10$.

Optionally, the distance between the evaporation source and the transfer substrate is in a range of 100 mm to 200 mm.

Optionally, in the step of heating the one or more transfer substrates, a mask is provided on a surface of the target substrate, on which a target film layer is to be formed.

Optionally, the mask is located above the target substrate, and the transfer substrate is located above the mask.

Optionally, the evaporation source is a linear evaporation source, and in the step of evaporating the evaporation material and forming the evaporation material particles towards the one or more transfer substrates by means of the evaporation source, the transfer substrate is located above the evaporation source.

Optionally, after the step of evaporating the evaporation material and forming the evaporation material particles towards the one or more transfer substrates by means of the evaporation source, so as to form the intermediate material layer on the surface of the transfer substrate, the method further comprises:

measuring a thickness of the intermediate material layer located on the transfer substrate; and performing the step of heating the one or more transfer substrates, when the thickness of the intermediate material layer reaches up to a preset value; or performing the step of evaporating the evaporation material and forming the evaporation material particles towards the one or more transfer substrates by means of the evaporation source, when the thickness of the intermediate material layer does not reach up to the preset value.

Accordingly, the embodiments of the present disclosure further provide an evaporation device, comprising an evaporation source and one or more transfer substrates, wherein the evaporation source is configured for evaporating evaporation material and forming evaporation material particles towards the one or more transfer substrates, so as to form an intermediate material layer on a surface of the transfer substrate, the evaporation device is configured such that the intermediate material layer is evaporated towards a target substrate when the one or more transfer substrates are heated, and a temperature of the heated transfer substrate being less than a temperature of the evaporation source.

Optionally, the surface of the transfer substrate, on which the intermediate material layer is formed, is provided with an anti-separating layer, and the anti-separating layer comprises a plurality of protrusions, a diameter of the protrusions and a distance between two adjacent protrusions being both less than $1/100$ of a distance between the transfer substrate and the target substrate, or the anti-separating layer comprises a plurality of recesses, a diameter of the recesses and a distance between two adjacent recesses being both less than $1/100$ of the distance between the transfer substrate and the target substrate.

Optionally, the evaporation device further comprises a measurement mechanism for measuring a thickness of the intermediate material layer located on the transfer substrate, and the evaporation device is configured to send a prompt signal when the thickness of the intermediate material layer measured by the measurement mechanism reaches up to a preset value.

Optionally, an area of the surface of the one or more transfer substrates receiving the evaporation material particles is greater than an area of an outlet of the evaporation source.

In the embodiments of the present disclosure, in order to form the target film layer on the target substrate by means of evaporating the evaporation material using the evaporation source, firstly, the evaporation material is evaporated towards the transfer substrate by the evaporation source, then the transfer substrate is heated such that the intermediate material layer is evaporated towards the target substrate. According to the embodiments of the present disclosure, since the temperature of the heated transfer substrate is less than the temperature of the evaporation source, it would not directly affect the target substrate even if the temperature of the evaporation source is relatively high. Thus, the evaporation accuracy may be improved. In addition, since the surface area of the transfer substrate receiving the evaporation material particles is greater than the area of the outlet of the evaporation source, it would not adversely affect the evaporation efficiency even if the temperature of the transfer substrate is relatively low and the sublimation speed of the intermediate material layer is relatively low. In contrast to the prior art, the distance between the evaporation source and the transfer substrate and the distance between the transfer substrate and the target substrate in the embodiments of the present disclosure are both relatively low, therefore, the use efficiency of the evaporation material may be improved while ensuring the evaporation accuracy.

BRIEF DESCRIPTION OF THE DRAWINGS

The accompanying drawings are provided to assist in sufficiently understanding the present disclosure, and they function as a portion of the specification. The present disclosure will be further described with reference to the accompanying drawings, in conjunction with the detailed embodiments, while the accompanying drawings are not intended to limit the present disclosure. In the drawings.

DETAILED DESCRIPTION OF PREFERRED EMBODIMENTS

The embodiments of the present disclosure will be described in detail with reference to the accompanying drawings. It should be understood that the detailed embodiments herein are only intended to describe and explain the present disclosure, and not limit the present disclosure.

Figure 1A:
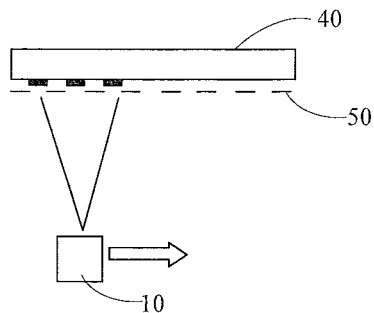
FIGS. 1a-1b are schematic views showing an evaporation process.
Figure 1B:
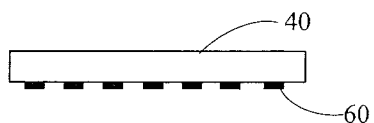

FIGS. 1a and 1b respectively show a schematic view of an evaporation scanning method. Generally, temperature of an evaporation source is relatively high, so as to evaporate evaporation material towards a substrate at a faster rate. However, the high temperature will deform a mask 50 and a target substrate 40 by a certain extent, resulting in a reduced evaporation accuracy. In the process of evaporating using a Fine Metal Mask (FMM), due to an affection from heat of the linear source on FMM evaporation accuracy, it is necessary to increase the distance between the linear source and the substrate in operation, thereby reducing use efficiency of the evaporation material. Furthermore, in order to make the thickness of a target film layer 60, which is formed on the target substrate by means of the linear source evaporation scanning method, more uniform, an evaporation source 10 is generally provided underneath the target substrate 40 and the mask 50, and the target substrate is evaporated from bottom to top. However, since the mask is relatively heavy, a relatively larger gap will be generated between the target substrate 40 and the mask 50 near the middle of the target substrate 40, thereby adversely affecting the evaporation accuracy.

Figure 2:
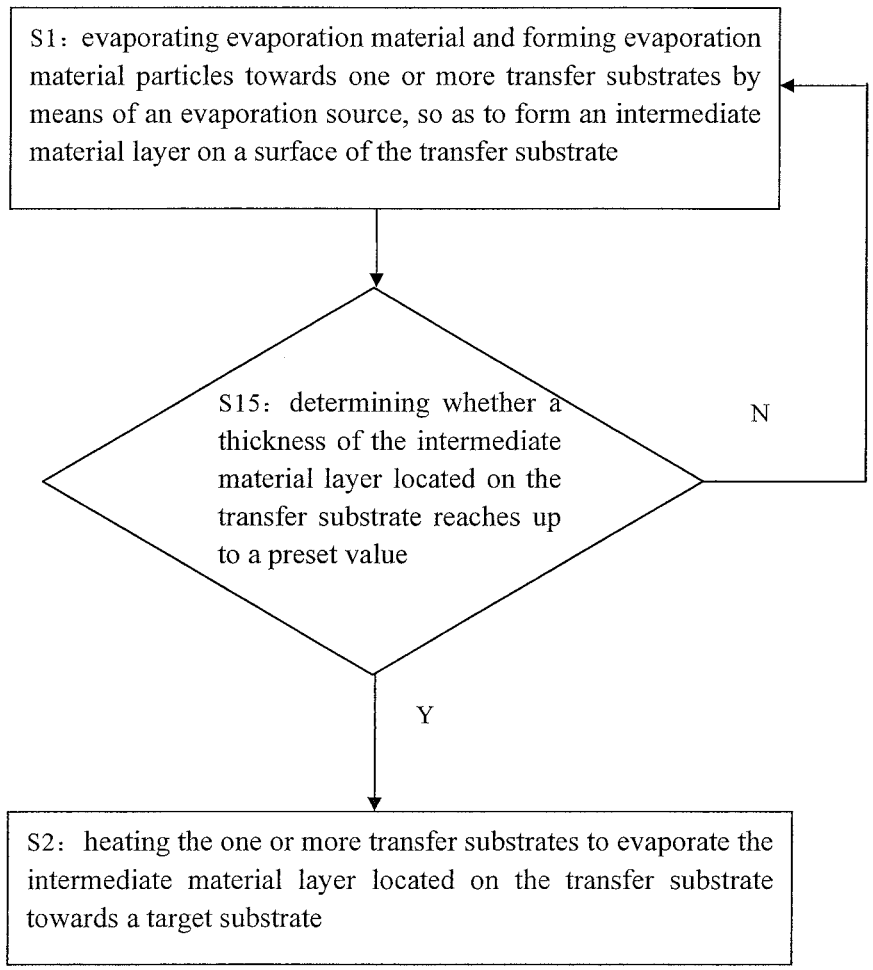
FIG. 2 is a flow chart of an evaporation method according to an embodiment of the present disclosure.
Figure 3A:
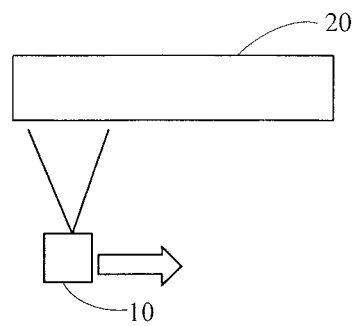
FIGS. 3a-3d are schematic views showing various steps of an evaporation method according to an embodiment of the present disclosure.
Figure 3B:
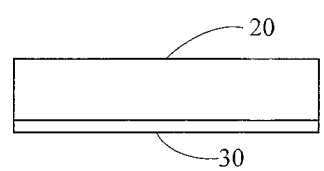
Figure 3C:
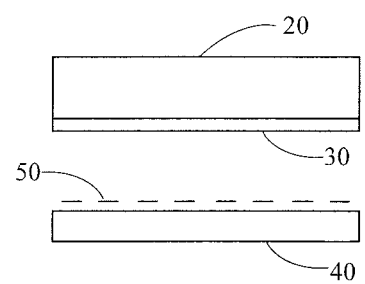

As an embodiment of the present disclosure, as shown in FIG. 2, there is provided an evaporation method, comprising:

S1: evaporating evaporation material and forming evaporation material particles towards a transfer substrate 20 by means of an evaporation source 10 (as shown in FIG. 3a), so as to form an intermediate material layer 30 on a surface of the transfer substrate 20 (as shown in FIG. 3b), wherein an area of the surface of the transfer substrate 20 receiving the evaporation material particles is greater than an area of an outlet of the evaporation source 10;

S2: heating the transfer substrate 20 to evaporate the intermediate material layer 30 located on the transfer substrate 20 towards a target substrate 40 (as shown in FIG. 3c), wherein a temperature of the heated transfer substrate 20 is less than a temperature of the evaporation source 10.

In the embodiment of the present disclosure, specifically, the evaporation source 10 firstly works to perform the first evaporation towards the transfer substrate 20, then the intermediate material layer 30 on the transfer substrate is made to perform the second evaporation towards the target substrate, wherein the temperature of the second evaporation is less than the temperature of the first evaporation. Thus, even if the temperature of the evaporation source 10 is relatively high, such high temperature cannot effect on the target substrate. In this way, the deformation of the target substrate or the mask due to the high temperature may be reduced, thereby improving the evaporation accuracy. In addition, since the area of the surface of the transfer substrate 20 receiving the evaporation material particles is greater than the area of the outlet of the evaporation source, that is, the area of the intermediate material layer 30 is greater than the area of the outlet of the linear evaporation source, it would not adversely affect the evaporation efficiency even if the temperature of the transfer substrate is relatively low and the sublimation speed of the intermediate material layer 30 is relatively low.

The evaporation method according to the embodiment of the present disclosure may be applied to evaporate display material of organic light emitting diode, and the organic light emitting diode may be manufactured through such an evaporation method.

In order to improve the use efficiency of the evaporation material in the evaporation process, in the embodiment of the present disclosure, a distance between the evaporation source 10 and the transfer substrate 20 and a distance between the transfer substrate 20 and the target substrate 40 are both less than a preset distance. The preset distance may be determined as a safe distance by which heat from the evaporation source 10 would not affect the target substrate 40 in a case that the evaporation material is directly evaporated on the target substrate 40 by means of the evaporation source 10.

The embodiment of the present disclosure perform two evaporation processes, in contrast to the one-time evaporation method, however, since the evaporation distance of each evaporation process is relatively small, material waste due to larger evaporation distance may be reduced, thereby improving the use efficiency of the evaporation material.

Optionally, the preset distance is in a range of 200 mm to 600 mm.

Optionally, a ratio of the distance between the transfer substrate 20 and the target substrate 40 to the distance between the evaporation source 10 and the transfer substrate 20 is in a range of ⅓ to ⅒. Thus, the use efficiency of the evaporation material may be improved while ensuring the evaporation accuracy.

In an optional embodiment of the present disclosure, the distance between the evaporation source 10 and the transfer substrate 20 is in a range of 100 mm to 200 mm. It is found that: the use efficiency of the evaporation material is related to the evaporation distance in the evaporation process, and under the same evaporation condition, the use efficiency of the evaporation material is inversely proportional to a square of the evaporation distance. In the actual evaporation process, if the distance between the evaporation source and the target position is 100±10 mm, then the use efficiency of the evaporation material may generally reach up to 80%~85%; if the distance between the evaporation source 10 and the target position is 300±10 mm, then the use efficiency of the evaporation material may generally reach up to 15%~20%. It can be seen that the distance between the evaporation source 10 and the transfer substrate 20 in the embodiment shown in FIGS. 3a-3d is greatly less than the evaporation distance in the embodiment shown in FIGS. 1a-1b. Thus, when the evaporation source 10 works to perform the first evaporation towards the transfer substrate 20, 80%~85% of the evaporation material may be utilized; when the intermediate material layer 30 on the transfer substrate 20 is made to perform the second evaporation towards the target substrate 40, the evaporation distance is further reduced such that the use efficiency of the evaporation material in the second evaporation is greater than that in the first evaporation. In comparison with the one-time evaporation method, the embodiment of the present disclosure evaporates the evaporation material on the target substrate by two evaporation processes, however, since the evaporation distance during the two evaporation processes is reduced, the use efficiency of the evaporation material is improved while the evaporation accuracy is ensured.

Figure 3D:

The evaporation method may be applied to form a target film layer on the whole surface of the target substrate 40, or form a target film layer having a certain shape on the target substrate 40. As an example, in the step of heating the transfer substrate, as shown in FIG. 3c, a mask 50 is provide on a surface of the target substrate 40, on which a target film layer 60 is to be formed. In this way, a target film layer 60 having a shape corresponding to the shape of the mask 50 may be formed (as shown in FIG. 3d). Since the transfer substrate 20 is heated by a relatively low temperature, it may reduce the adverse affection on the mask 50 due to high temperature and prevent the mask from deformation, thereby improving the evaporation accuracy. In an optional embodiment of the present disclosure, a fine metal mask may be used as the mask 50.

Optionally, in the step S2, the mask 50 is located above the target substrate 40, and the transfer substrate 20 is located above the mask 50. As a result, the surface of the transfer substrate 20 on which the intermediate material layer 30 is formed faces downward. In this way, when the transfer substrate 20 is heated, the particles derived from the sublimation of the intermediate material layer 30 are deposited downward. By virtue of the gravity of the mask 50, the mask 50 may be brought into close contact with the target substrate 40, thereby avoiding the adverse affection on the evaporation accuracy due to a gap.

In the step S2 of the embodiment of the present disclosure, the temperature of the transfer substrate 20 is relatively low, it therefore suppresses the deformation of the mask 50 and the target substrate 40. The relatively low temperature makes the intermediate material layer 30 on the transfer substrate 20 evaporate relatively lowly. Thus, in the step S2, it is necessary to heat the transfer substrate 20 for a long time, until the desired pattern of the target film layer 60 is formed on the target substrate 40.

Specifically, the evaporation source 10 is a linear evaporation source. As shown in FIG. 3a, in the step S2, the transfer substrate 20 is located above the evaporation source 10, thus, it can avoid non-uniform distribution of the thickness of the intermediate material layer 30 due to the gravity effect of the evaporation material.

Optionally, as shown in FIG. 2, after the step S1, the method according to the embodiment of the present disclosure further comprises:

S15: measuring a thickness of the intermediate material layer 30 located on the transfer substrate 20; and performing the step S2, when the thickness of the intermediate material layer 30 reaches up to a preset value; or performing the step S1, when the thickness of the intermediate material layer 30 does not reach up to the preset value. In this way, it can ensure that it is sufficient for the thickness of the intermediate material layer 30 formed on the transfer substrate 20 to form the desired film layer on the target substrate. Furthermore, in this way, it can prevent an over-thick intermediate material layer 30 on the transfer substrate 20 and therefore material waste.

Specifically, a plurality of positions on the intermediate material layer 30 may be measured, so as to obtain the thickness of the intermediate material layer 30. If the thicknesses at the plurality of positions all reach the preset value and the thicknesses at the plurality of positions are the same, then it represents that the thickness of the intermediate material layer 30 is relatively uniform. Then, the transfer substrate 20 may be heated such that the thickness of the finally formed film layer on the target substrate 40 is more uniform. For example, the plurality of positions at least includes a central position and two end positions of the intermediate material layer 30. It should be understood that, if more measurement positions on the intermediate material layer 30 are used, it can ensure that the thickness of the intermediate material layer 30 is more uniform.

As described above, the temperature of the heated transfer substrate 20 is less than the temperature of the evaporation source 10. Thus, the speed of evaporating the evaporation material and forming the evaporation material particles towards the transfer substrate 20 by means of the evaporation source 10 is relatively large, while the speed of evaporating the intermediate material layer 30 located on the transfer substrate 20 and forming the evaporation material particles is relatively small.

In addition, in an actual production process, a plurality of transfer substrates 20 may be provided. In the step S1, the intermediate material layers 30 having the same thickness are formed on the plurality of transfer substrates 20 by means of the evaporation source 10. Then, in the step S2, the plurality of transfer substrates 20 are simultaneously heated, such that the intermediate material layers 30 located on the plurality of transfer substrates 20 may be simultaneously evaporated on the target substrate, thereby improving the process efficiency.

As another embodiment of the present disclosure, there is provided an evaporation device. The evaporation device may comprise an evaporation source 10 and a transfer substrate 20. The evaporation source 10 is configured for evaporating evaporation material and forming evaporation material particles towards the transfer substrate 20, so as to form an intermediate material layer on a surface of the transfer substrate 20; the evaporation device is configured such that the intermediate material layer 30 is evaporated towards a target substrate 40 when the transfer substrate 20 is heated; and an area the surface of the transfer substrate 20 receiving the evaporation material particles is greater than an area of an outlet of the evaporation source 10, and the temperature of the heated transfer substrate 20 is less than the temperature of the evaporation source 10. Thus, if such an evaporation device performs the evaporation process, the temperature of the transfer substrate 20 when being heated is less than the temperature of the evaporation source 10.

Specifically, when such an evaporation device is used to perform the evaporation process, a mask 50 may be used to form a patterned target film layer 60 on the target substrate. According to an optional embodiment of the present disclosure, the mask 50 is provided on a surface of the target substrate 40, on which the target film layer 60 is to be formed, thus, the target film layer having a shape corresponding to the shape of the mask 50 may be formed on the target substrate 40. Since the temperature of the transfer substrate 20 is relatively lower than the temperature of the evaporation source 10, it reduces deformation possibility of the mask due to high temperature, thereby improving the evaporation accuracy.

Optionally, the mask 50 is located above the target substrate 40, and the transfer substrate 20 is located above the mask 50. By virtue of the gravity of the mask 50, the mask 50 may be brought into close contact with the target substrate 40, thereby improving the evaporation accuracy.

In the embodiment of the present disclosure, the evaporation source 10 is a linear evaporation source. When the evaporation source 10 works to evaporate the evaporation material and form the evaporation material particles towards the transfer substrate 20, the transfer substrate 20 is located above the evaporation source 10. It should be understood that the evaporation process may be performed in a process chamber. With the action of power of electrodes in the process chamber, the evaporation material particles may be formed and moved upward from the evaporation source. If the evaporation material particles are moved out of the evaporation source 10 from bottom to top, it can avoid non-uniform distribution of the thickness of the intermediate material layer 30 due to the gravity effect of the evaporation material in the process of scanning of the linear evaporation source.

Further, an anti-separating layer may be formed on the surface of the transfer substrate 20 on which the intermediate material layer 30 is formed. The anti-separating layer may comprise a plurality of protrusions, a diameter of the protrusions and a distance between two adjacent protrusions are both less than $1/100$ of a distance between the transfer substrate 20 and the target substrate 40; or, the anti-separating layer comprises a plurality of recesses, a diameter of the recesses and a distance between two adjacent recesses are both less than $1/100$ of the distance between the transfer substrate 20 and the target substrate 40. In this way, an adhesive force between the intermediate material layer 30 and the transfer substrate 20 may be increased. In addition, the protrusions or the recesses may allow the evaporation material particles from the intermediate material layer 30 to sublimate and move in various directions when it is heated, thereby achieving a large-area and uniform evaporation.

Further, the evaporation device may further comprise a measurement mechanism for measuring a thickness of the intermediate material layer located on the transfer substrate. The evaporation device is configured to send a prompt signal when the thickness of the intermediate material layer measured by the measurement mechanism reaches up to a preset value. An operator can determine that the thickness of the intermediate material layer 30 located on the transfer substrate has reached up to the preset value according to the prompt signal. Then, the operator may stop the evaporation source 10 evaporating the evaporation material towards the transfer substrate 20, and may heat the transfer substrate, so as to evaporate the intermediate material layer 30 towards the target substrate.

Specifically, a plurality of positions on the intermediate material layer 30 may be measured by the measurement mechanism, so as to obtain the thickness of the intermediate material layer 30. If the thicknesses at the plurality of positions are the same, then it represents that the thickness of the intermediate material layer 30 is relatively uniform. Then, the transfer substrate 20 may be heated such that the thickness of the finally formed film layer on the target substrate 40 is more uniform. For example, the plurality of positions at least includes a central position and two end positions of the intermediate material layer 30. It should be understood that, if more measurement positions on the intermediate material layer 30 are used, it can ensure that the thickness of the intermediate material layer 30 is more uniform.

Optionally, the thickness of the target film layer formed on the target substrate may be measured by the measurement mechanism, thereby it may be determined whether the target film layer finally formed on the target substrate reaches up to the desired thickness.

In addition, in an actual production process, a plurality of transfer substrates 20 may be provided. The intermediate material layers 30 having the same thickness are formed on the plurality of transfer substrates 20 by means of the evaporation source 10. Then, the plurality of transfer substrates 20 are simultaneously heated, such that the intermediate material layers 30 located on the plurality of transfer substrates 20 may be simultaneously evaporated on the target substrate, thereby improving the process efficiency.

The evaporation method and the evaporation device according to the embodiments of the present disclosure have been described above. In view of the description, it can be seen that, in order to form the target film layer on the target substrate by means of evaporating the evaporation material using the evaporation source, firstly, the evaporation material is evaporated towards the transfer substrate by the evaporation source, then the transfer substrate is heated such that the intermediate material layer is evaporated towards the target substrate. According to the embodiments of the present disclosure, since the temperature of the heated transfer substrate is less than the temperature of the evaporation source, it would not directly affect the target substrate even if the temperature of the evaporation source is relatively high. Thus, the evaporation accuracy may be improved. In addition, since the surface area of the transfer substrate receiving the evaporation material particles is greater than the area of the outlet of the evaporation source, it would not adversely affect the evaporation efficiency even if the temperature of the transfer substrate is relatively low and the sublimation speed of the intermediate material layer is relatively low. In contrast to the prior art, the distance between the evaporation source and the transfer substrate and the distance between the transfer substrate and the target substrate in the embodiments of the present disclosure are both relatively low, therefore, the use efficiency of the evaporation material may be improved while ensuring the evaporation accuracy.

It will be appreciated that the above-described embodiments are only exemplary embodiments for describing the principle of the present disclosure, however, the scope of the present disclosure is not limited hereto. Alternatives and modifications to the present disclosure may be made by the skilled person in the art without departing from the spirit and scope of the present disclosure, and these alternatives and modifications should fall into the scope of the present disclosure.

What is claimed is:

1. An evaporation method, comprising:
   evaporating evaporation material and forming evaporation material particles towards one or more transfer substrates by means of an evaporation source, so as to form an intermediate material layer on a surface of the transfer substrate;
   heating the one or more transfer substrates to evaporate the intermediate material layer located on the transfer substrate towards a target substrate, a temperature of the heated transfer substrate being less than a temperature of the evaporation source,
   wherein an area of the surface of the one or more transfer substrates receiving the evaporation material particles is greater than an area of an outlet of the evaporation source.

2. The evaporation method according to claim 1, wherein, a distance between the evaporation source and the transfer substrate and a distance between the transfer substrate and the target substrate are both less than a preset distance, wherein the preset distance is in a range of 200 mm to 600 mm.

3. The evaporation method according to claim 2, wherein, a ratio of the distance between the transfer substrate and the target substrate to the distance between the evaporation source and the transfer substrate is in a range of 1/3 to 1/10.

4. The evaporation method according to claim 3, wherein, the distance between the evaporation source and the transfer substrate is in a range of 100 mm to 200 mm.

5. The evaporation method according to claim 2, wherein, the distance between the evaporation source and the transfer substrate is in a range of 100 mm to 200 mm.

6. The evaporation method according to claim 2, wherein, in the step of heating the one or more transfer substrates, a mask is provided on a surface of the target substrate, on which a target film layer is to be formed.

7. The evaporation method according to claim 1, wherein, the distance between the evaporation source and the transfer substrate is in a range of 100 mm to 200 mm.

8. The evaporation method according to claim 1, wherein, in the step of heating the one or more transfer substrates, a mask is provided on a surface of the target substrate, on which a target film layer is to be formed.

9. The evaporation method according to claim 8, wherein, the mask is located above the target substrate, and the transfer substrate is located above the mask.

10. The evaporation method according to claim 1, wherein,
    the evaporation source is a linear evaporation source, and
    in the step of evaporating the evaporation material and forming the evaporation material particles towards the one or more transfer substrates by means of the evaporation source, the transfer substrate is located above the evaporation source.

11. The evaporation method according to claim 1, wherein,
    after the step of evaporating the evaporation material and forming the evaporation material particles towards the one or more transfer substrates by means of the evaporation source, so as to form the intermediate material layer on the surface of the transfer substrate, the method further comprises:
    measuring a thickness of the intermediate material layer located on the transfer substrate; and
    performing the step of heating the one or more transfer substrates, when the thickness of the intermediate material layer reaches up to a preset value; or
    performing the step of evaporating the evaporation material and forming the evaporation material particles towards the one or more transfer substrates by means of the evaporation source, when the thickness of the intermediate material layer does not reach up to the preset value.

* * * * *